United States Patent
Hwang

(10) Patent No.: US 12,096,605 B2
(45) Date of Patent: Sep. 17, 2024

(54) POWER ELECTRONIC DEVICE WITH AUTOMATIC VENTILATION MODULE

(71) Applicant: LS ELECTRIC CO., LTD., Anyang-si (KR)

(72) Inventor: Soo-Yong Hwang, Anyang-si (KR)

(73) Assignee: LS ELECTRIC CO., LTD., Anyang-si (KR)

(*) Notice: Subject to any disclaimer, the term of this patent is extended or adjusted under 35 U.S.C. 154(b) by 450 days.

(21) Appl. No.: 17/601,524

(22) PCT Filed: Mar. 19, 2020

(86) PCT No.: PCT/KR2020/003811
§ 371 (c)(1),
(2) Date: Oct. 5, 2021

(87) PCT Pub. No.: WO2020/204422
PCT Pub. Date: Oct. 8, 2020

(65) Prior Publication Data
US 2022/0183193 A1    Jun. 9, 2022

(30) Foreign Application Priority Data
Apr. 5, 2019 (KR) .......... 10-2019-0040226

(51) Int. Cl.
*H05K 7/20* (2006.01)
(52) U.S. Cl.
CPC ..... *H05K 7/20909* (2013.01); *H05K 7/20145* (2013.01); *H05K 7/20945* (2013.01)
(58) Field of Classification Search
CPC ........... H05K 7/20909; H05K 7/20145; H05K 7/20945; H05K 7/20554;
(Continued)

(56) References Cited

U.S. PATENT DOCUMENTS 6,176,777 B1 *  1/2001  Smith ................. F24F 13/062
                                                454/302
2009/0059523 A1    3/2009  Mallia et al.
(Continued)

FOREIGN PATENT DOCUMENTS

CN    203691841 U    7/2014
JP    H11307970 A    11/1999
(Continued)

OTHER PUBLICATIONS

Robert Kral, Electric vs. Pneumatic Actuators, Feb. 3, 2015, Assembly, p. 2 https://www.assemblymag.com/articles/92657-electric-vs-pneumatic-actuators (Year: 2015).*
(Continued)

*Primary Examiner* — Edelmira Bosques
*Assistant Examiner* — Michael James Giordano
(74) *Attorney, Agent, or Firm* — K&L Gates LLP

(57) ABSTRACT

The present disclosure relates to a power electronic device with an automatic ventilation module, comprising: an enclosure in which a heating component is accommodated; and an automatic ventilation module, installed on one side of the enclosure, for opening and closing a part of the enclosure based on the temperature of the heating component, wherein the automatic ventilation module comprises a driving unit for generating power; a connection unit for transmitting the power generated by the driving unit; a ventilation unit for receiving the power from the connection unit and disposed with a front plate for opening and closing a part of the enclosure; a temperature sensor for measuring the temperature of the inside of the enclosure; and a control unit for controlling the driving unit on the basis of a measured value of the temperature sensor so as to adjust the degree of opening and closing of the front plate.

18 Claims, 11 Drawing Sheets

(58) Field of Classification Search
CPC ....... F24F 13/10–1406; F24F 13/1426; H02M 7/48; H02B 1/56
See application file for complete search history.

(56) References Cited

U.S. PATENT DOCUMENTS

| | | | |
|---|---|---|---|
| 2009/0323280 A1* | 12/2009 | Wu | H05K 7/20181 361/690 |
| 2013/0087320 A1 | 4/2013 | James et al. | |
| 2016/0037677 A1* | 2/2016 | Yamanaka | H05K 7/20918 361/697 |
| 2016/0054046 A1 | 2/2016 | Sim | |

FOREIGN PATENT DOCUMENTS

| | | | |
|---|---|---|---|
| KR | 20090096281 A | | 9/2009 |
| KR | 100939281 B1 | | 1/2010 |
| KR | 20130117011 A | * | 10/2013 |
| KR | 20140133437 A | | 11/2014 |

OTHER PUBLICATIONS

International Search Report for related International Application No. PCT/KR2020/003811; report dated Oct. 8, 2020; (5 pages).
Written Opinion for related International Application No. PCT/KR2020/003811; report dated Oct. 8, 2020; (5 pages).
Office Action for related Chinese Application No. 202080026242.1; action dated May 28, 2024; 6 pages).
Search Report for related Chinese Application No. 202080026242.1; action dated Mar. 19, 2020; 3 pages).

* cited by examiner

1

POWER ELECTRONIC DEVICE WITH AUTOMATIC VENTILATION MODULE

CROSS-REFERENCE TO RELATED APPLICATIONS

This application is the National Stage filing under 35 U.S.C. 371 of International Application No. PCT/KR2020/003811, filed on Mar. 19, 2020, which claims the benefit of earlier filing date and right of priority to Korea utility model Application No. 10-2019-0040226 filed on Apr. 5, 2019, the contents of which are all hereby incorporated by reference herein in their entirety.

FIELD

The present disclosure relates to a power electronic device having an automatic ventilation module that detects a temperature of the device and automatically dissipates heat based on the temperature of the power electronic device.

BACKGROUND

An industrial power electronic device is generally installed and used outdoors or indoors and has a configuration in which main components and a heat-dissipation structure are disposed inside a casing. The industrial power electronic device may be, for example, a power conversion device such as an inverter. The industrial power electronic device such as the inverter often emits high-temperature heat, and thus has a ventilation structure for heat-dissipation.

FIG. 1 is an example showing a heat-dissipation structure of a conventional electronic device. FIG. 2 is a side view showing the heat-dissipation structure of the power electronic device based on FIG. 1.

As shown in FIG. 1, a conventional power electronic device 1 acts as an inverter, and has an upper casing 10 and a lower casing 20 which are mutually coupled to each other to constitute an exterior appearance. A plurality of ventilation holes 10a for natural heat-dissipation extend through the upper casing 10. A circuit 15 may be installed inside the upper casing 10.

A plurality of main inflow holes 20a and main discharge holes 20b may extend through the lower casing 20 and may be disposed in opposite sides, respectively. Although not shown in the drawings, a fan for flowing air may be installed adjacent to the main inflow hole 20a.

A partitioning wall 40 may be additionally installed inside the lower casing 20. The partitioning wall 40 divides an inner space of the lower casing 20 into upper and lower spaces. A heat sink 30 is disposed in the upper space, while parts that are not sensitive to foreign substances, such as a DCR (Differential Current Relay) 26 may be mounted in the lower space.

Further, an auxiliary inflow hole 51 through which air introduced through the main inflow hole 20a passes may be formed in one side of the partitioning wall 40, while an auxiliary discharge hole 52 through which the air circulated in the lower space is discharged may be formed in the other side thereof.

The conventional power electronic device has a problem in that heat-dissipation efficiency is low because heat of the heat sink is dissipated using natural convection when a fan is not installed.

Further, when the fan is disposed to improve heat-dissipation efficiency, heat-dissipation efficiency may be improved. However, because the main inflow hole and main discharge hole are always open, outside air continues to circulate regardless of a temperature, and foreign substances inflow into the inverter.

SUMMARY

A purpose of the present disclosure is to provide a power electronic device having an automatic ventilation module that detects a temperature of the device and automatically dissipates heat based on the temperature of the power electronic device.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

One aspect of the present disclosure provides a power electronic device comprising: a casing constituting an exterior appearance of the device; and an automatic ventilation module installed on one side of the casing for opening or closing a portion of the casing, wherein the automatic ventilation module includes: a driver installed on one side of an inner space of the casing for generating power; a connector for transmitting the power generated from the driver; a ventilator having a front plate to receive the power from the connector and to open or close a portion of the casing using the power; and a controller configured to control the driver to adjust an opening or closing amount of the front plate.

A displacement amount of the front plate is adjusted based on a displacement amount of the driver.

The driver includes: a motor rotating in a forward or reverse direction; a power transmission for converting a rotational motion of the motor into a linear motion of the power transmission; a piston rod and a piston raised up or lowered down by the power output from the power transmission; and a cylinder accommodating therein the piston; wherein one end of the piston rod is exposed out of the cylinder.

The connector includes: at least one link pivotally connected to the piston rod; and a rotator coupled to the link and rotated by a predetermined angle by the link.

The connector further includes a movable rod having one end connected to one side of the rotator and an opposite end connected to the front plate, wherein the movable rod pushes or pulls the front plate based on a rotation direction of the rotator.

The ventilator further includes: a cylindrical body passing through one side plate face portion of the casing, wherein the body has both opposing open ends; and a rear plate coupled to one of both the open ends of the body, disposed in the inner space of the casing and having a hole in a plate face portion thereof.

The front plate opens or close the other of both the open ends of the body.

The movable rod has a screw thread formed on an outer circumferential face thereof, and pass through the rear plate and is coupled to the front plate, wherein the rear plate has a screw groove corresponding to the screw thread, wherein the groove is defined in a portion of the rear plate through which the movable rod pass.

The connector includes: a first link having one end pivotally coupled to the piston rod and an opposite end extends forward the rotator; and the second link having one end pivotally coupled to the first link and an opposite end fixed to the rotator.

When the piston rod ascends, the first link ascends such that the second link rotates the rotator, and the movable rod to press the front plate in a direction away from the casing by the rotator.

The automatic ventilation module further includes a temperature sensor installed in the inner space of the casing to measure a temperature of the inner space or a temperature of a component accommodated in the inner space and generating heat, wherein the controller is configured adjust the opening or closing amount of the front plate, based on a measurement result of the temperature sensor, a preset control sequence, or a manual manipulation by a user.

The device further comprises a blow fan installed adjacent to the component generating the heat, wherein an operation of the fan is controlled by the controller.

The controller is configured: when a measured value of the temperature sensor is lower than a preset first threshold value, to activate the blow fan and not to move the front plate; when the measured value of the temperature sensor is between the preset first threshold value and a preset second threshold value, to activate the blow fan and to move the front plate so that the front plate and the casing are spaced from each other by a preset spacing; or when the measured value of the temperature sensor exceeds the preset second threshold value, to activate the blow fan and to move the front plate so that the front plate and the casing are spaced from each other by a preset maximum spacing larger than the preset spacing.

Another aspect of the present disclosure provides a power electronic device comprising: a casing having an upper casing and a lower casing coupled to a bottom of the upper casing; and an automatic ventilation module including: a driver installed on one side of an inner space of the upper casing to generate power; a connector for transmitting the power generated from the driver; a ventilator having a front plate for receiving the power from the connector to open or close a portion of the upper casing; and a controller configured to control the driver to adjust an opening or closing amount of the front plate.

In another aspect of the present disclosure, the driver includes: a motor rotating in a forward or reverse direction; a power transmission for converting a rotational motion of the motor into a linear motion of the power transmission; a piston rod and a piston lowered or raised by the power output from the power transmission; and a cylinder accommodating therein the piston, wherein one end of the piston rod is exposed out of the cylinder.

In another aspect of the present disclosure, the connector includes: a first link having one end pivotally coupled to the piston rod and an opposite end extends forward the rotator; the second link having one end pivotally coupled to the first link and an opposite end fixed to the rotator; the rotator coupled to the second link and rotating by a predetermined angle by the second link; and a movable rod having one end connected to one side of the rotator and an opposite end connected to the front plate, wherein the movable rod is configured to push or pull the front plate, based on a rotation direction of the rotator.

In another aspect of the present disclosure, the ventilator further includes: a cylindrical body passing through one side plate face portion of the casing, wherein the body has both opposing open ends; and a rear plate coupled to one of both the open ends of the body, disposed in the inner space of the casing and having a hole in a plate face portion thereof, wherein the front plate opens or close the other of both the open ends of the body.

In another aspect of the present disclosure, the movable rod has a screw thread formed on an outer circumferential face thereof, and pass through the rear plate and is coupled to the front plate, wherein the rear plate has a screw groove corresponding to the screw thread, wherein the groove is defined in a portion of the rear plate through which the movable rod pass.

In another aspect of the present disclosure, when the piston rod ascends, the first link ascends such that the second link rotates the rotator, and the movable rod to press the front plate in a direction away from the casing by the rotator.

The power electronic device having the automatic ventilation module according to the present disclosure may sense the temperature of the power electronic device and automatically open or close the ventilation hole based on the temperature, thereby dissipating the heat. Therefore, the heat-dissipation efficiency of the power electronic device may be improved and the inflow of foreign substances from the outside into the device may be prevented.

The above-described effects, and specific effects of the present disclosure as not mentioned above will be described based on specific details for carrying out the disclosure.

DETAILED DESCRIPTIONS

Figure 1:
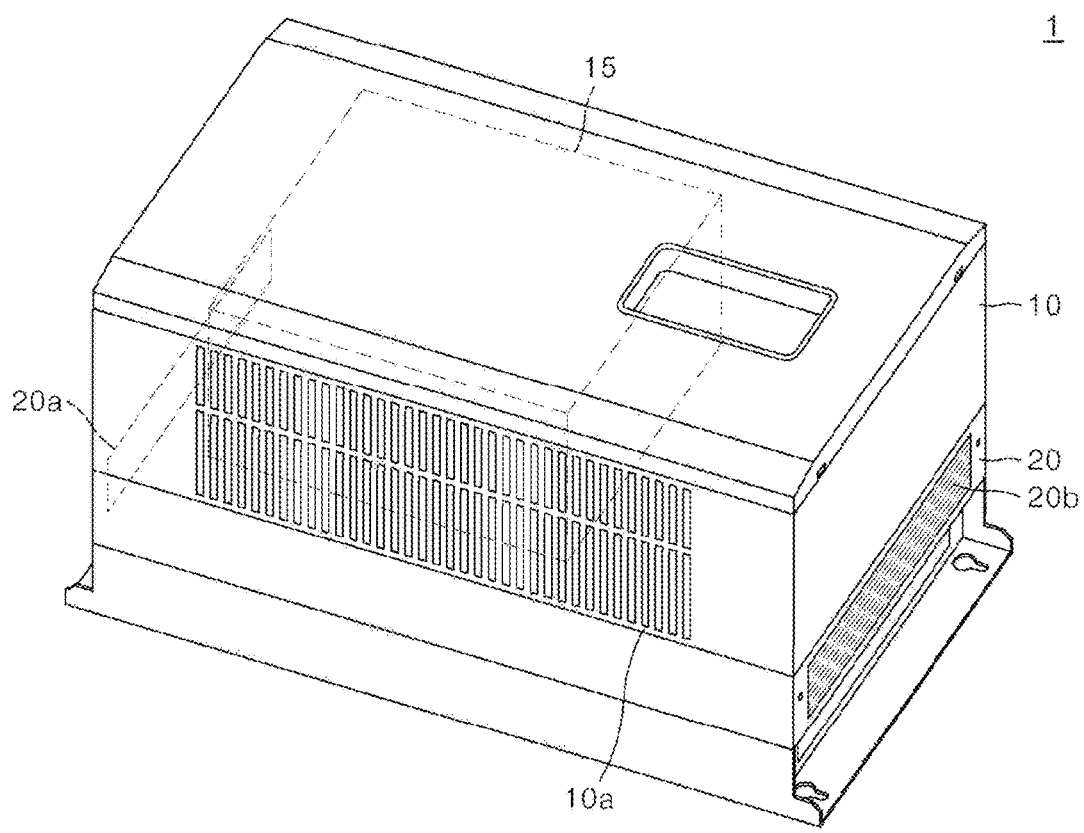
FIG. 1 is an example showing a heat-dissipation structure of a conventional electronic device.
Figure 2:
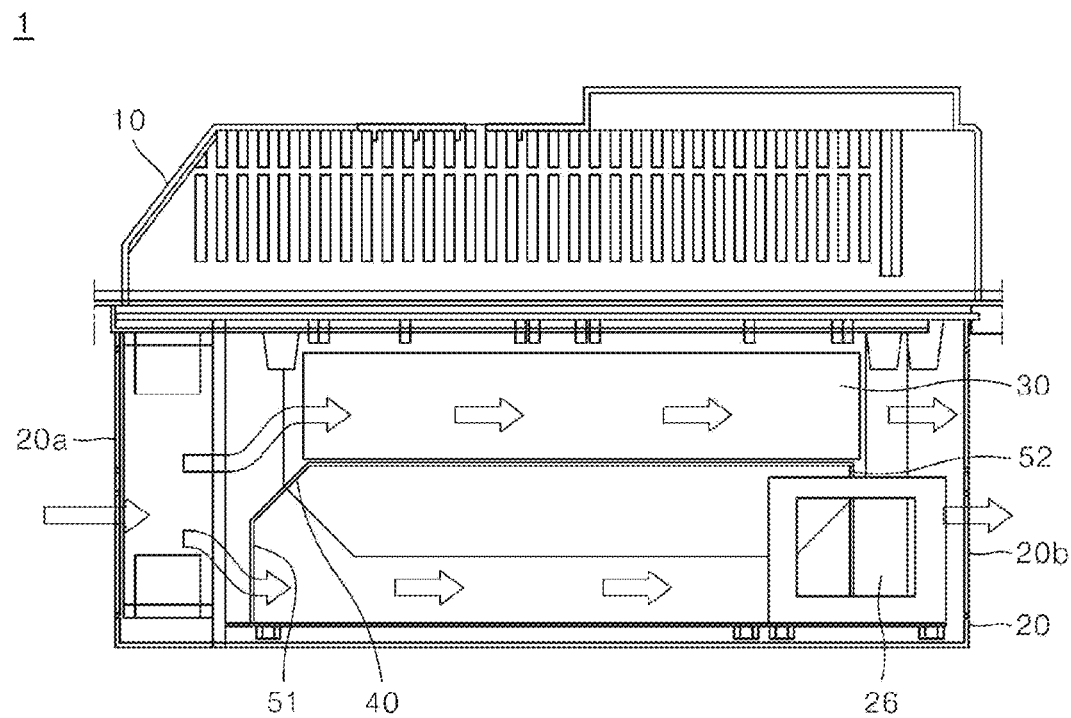
FIG. 2 is a side view showing the heat-dissipation structure of the power electronic device based on FIG. 1.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Figure 3:
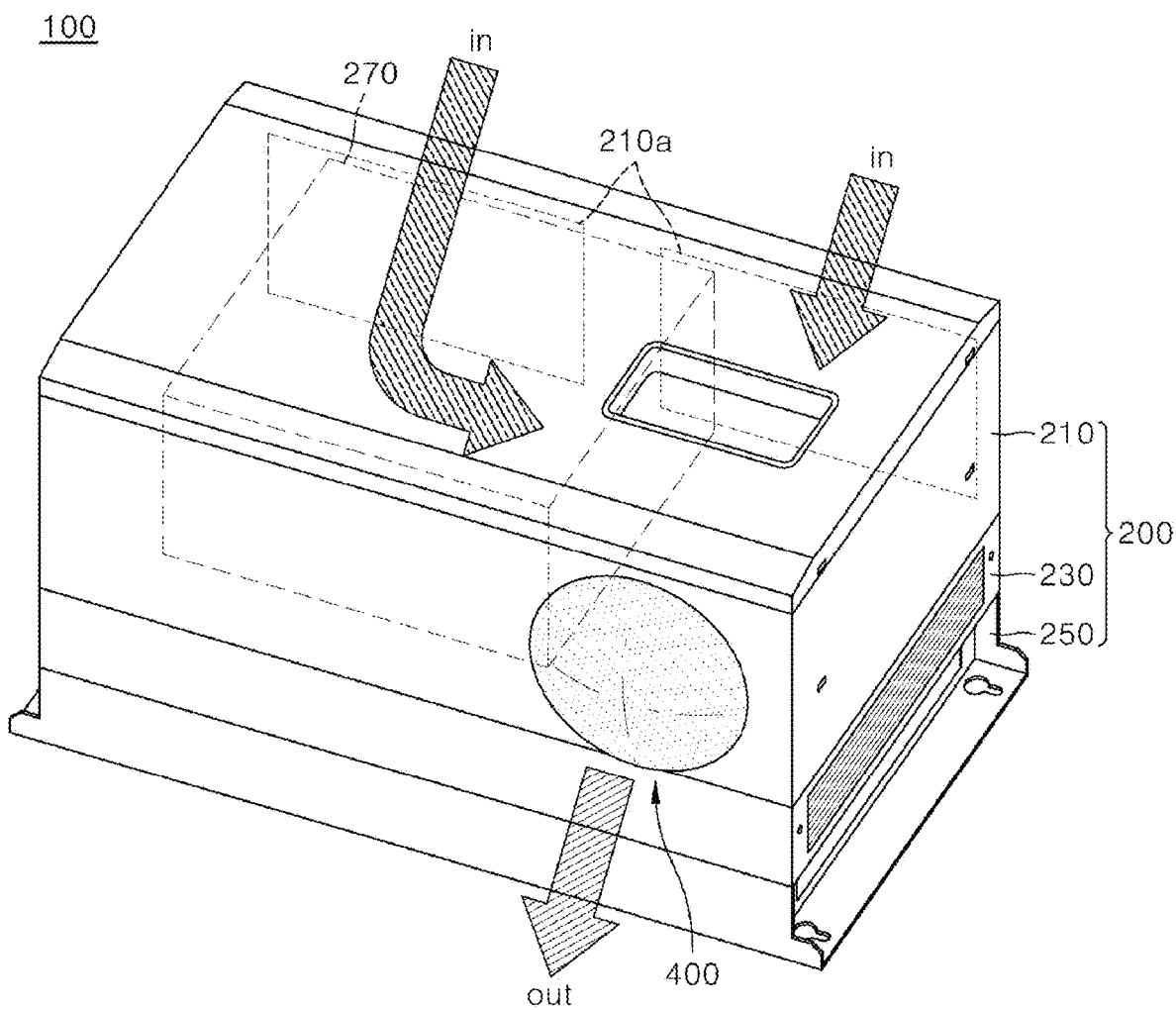
FIG. 3 is a perspective view showing a power electronic device having an automatic ventilation module according to an embodiment of the present disclosure.
Figure 4:
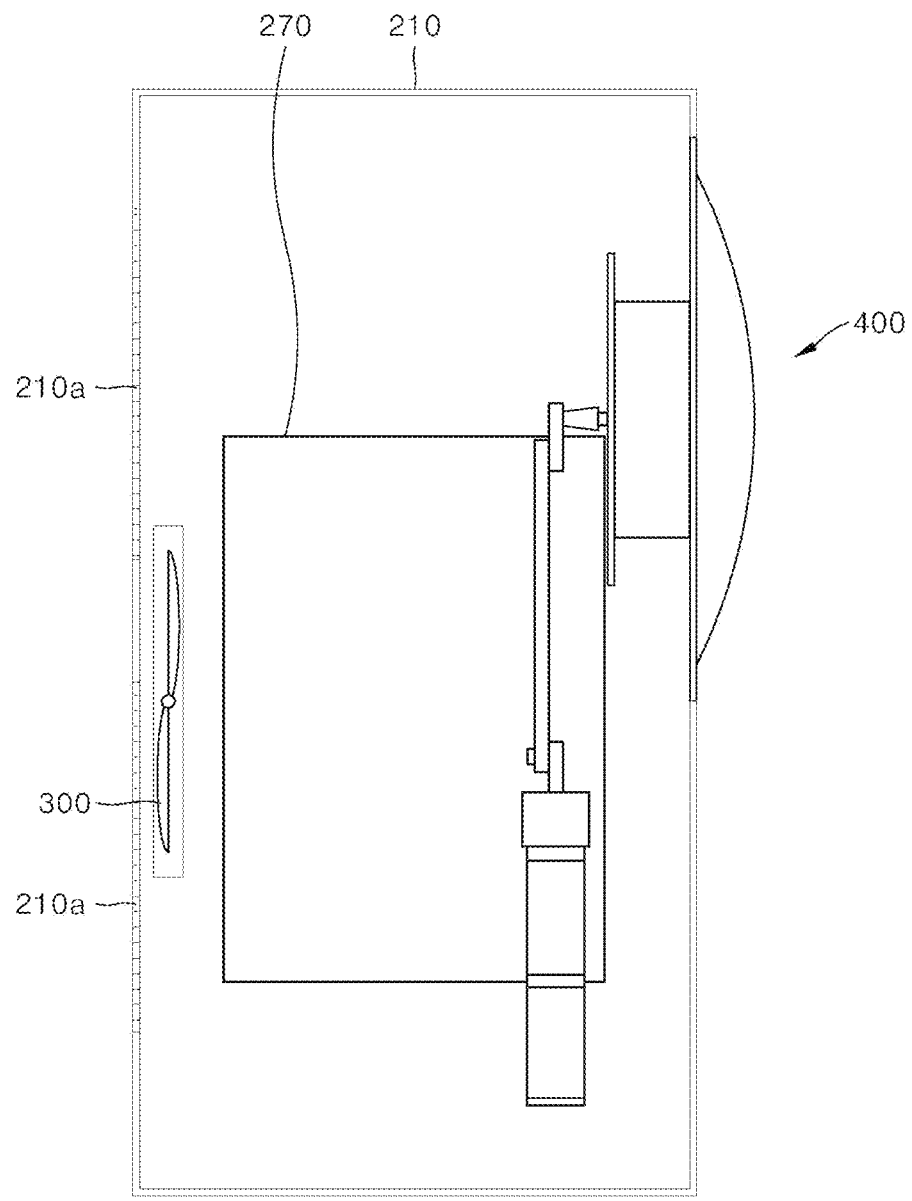
FIG. 4 is a schematic diagram showing an inside of the power electronic device having the automatic ventilation module based on FIG. 3.
Figure 5:
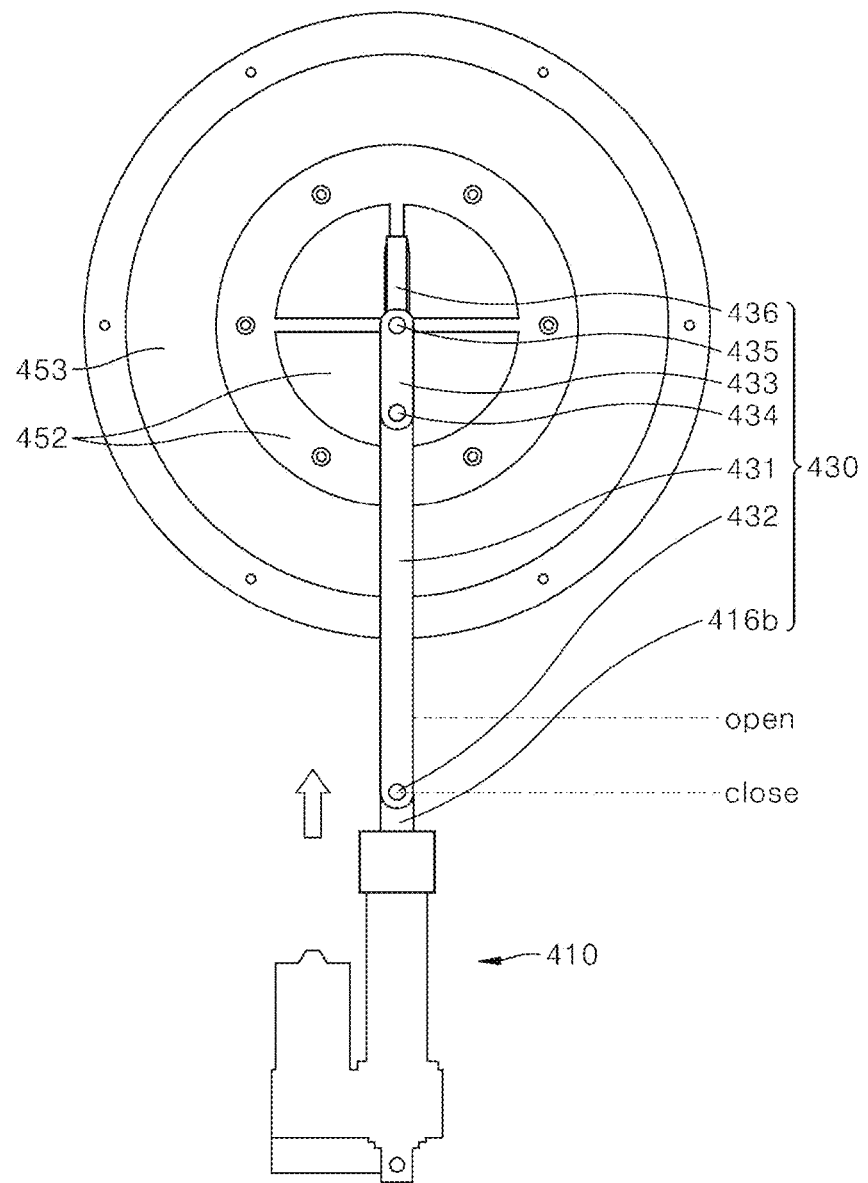
FIG. 5 is a rear view showing a closed state of a ventilation hole of the automatic ventilation module of the power electronic device according to the present disclosure.
Figure 6:
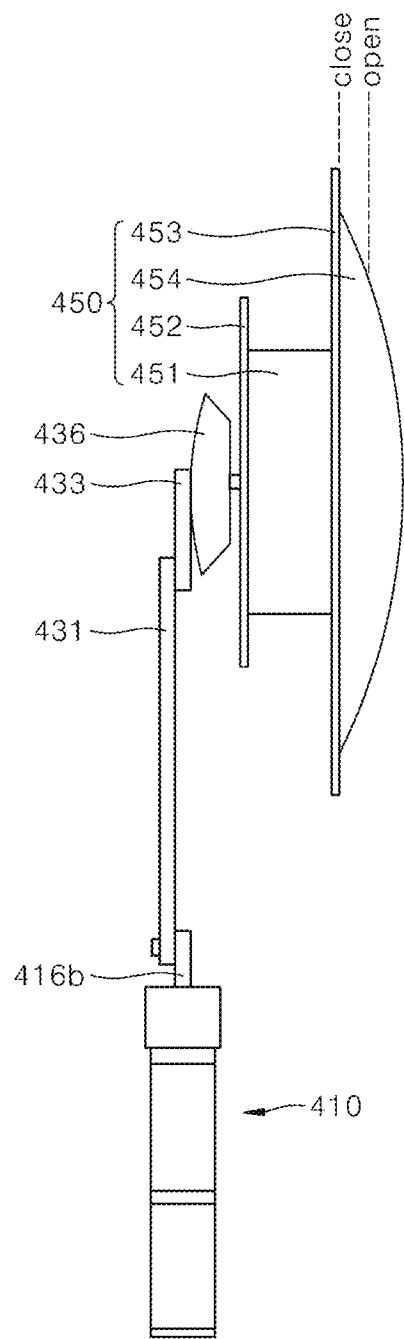
FIG. 6 is a side view showing the closed state of the ventilation hole of the automatic ventilation module of the power electronic device according to the present disclosure.
Figure 7:
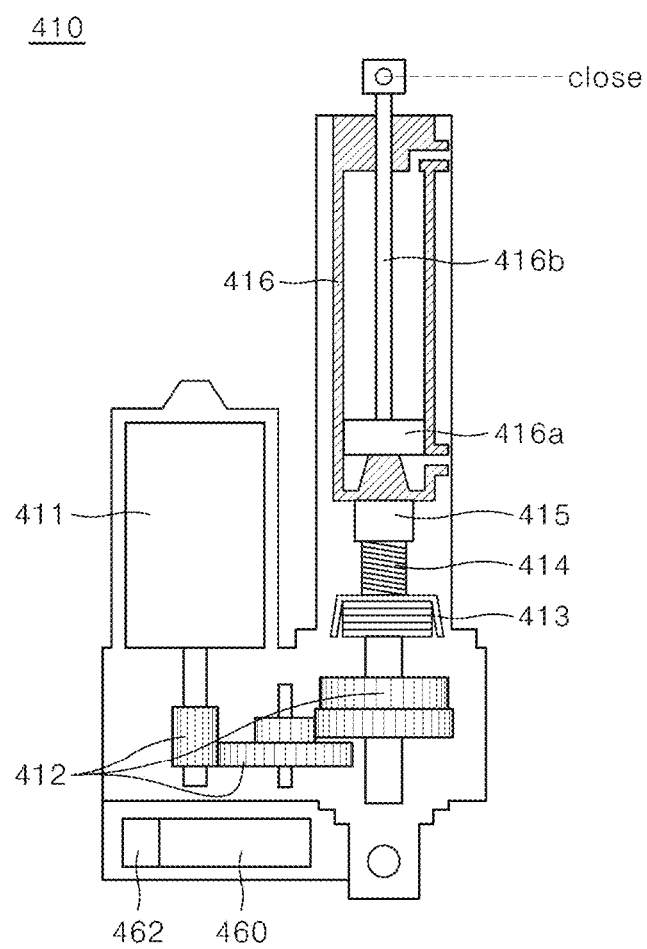
FIG. 7 is a cross-sectional view showing an operation state of a driver in the closed state of the ventilation hole based on FIG. 5.
Figure 8:
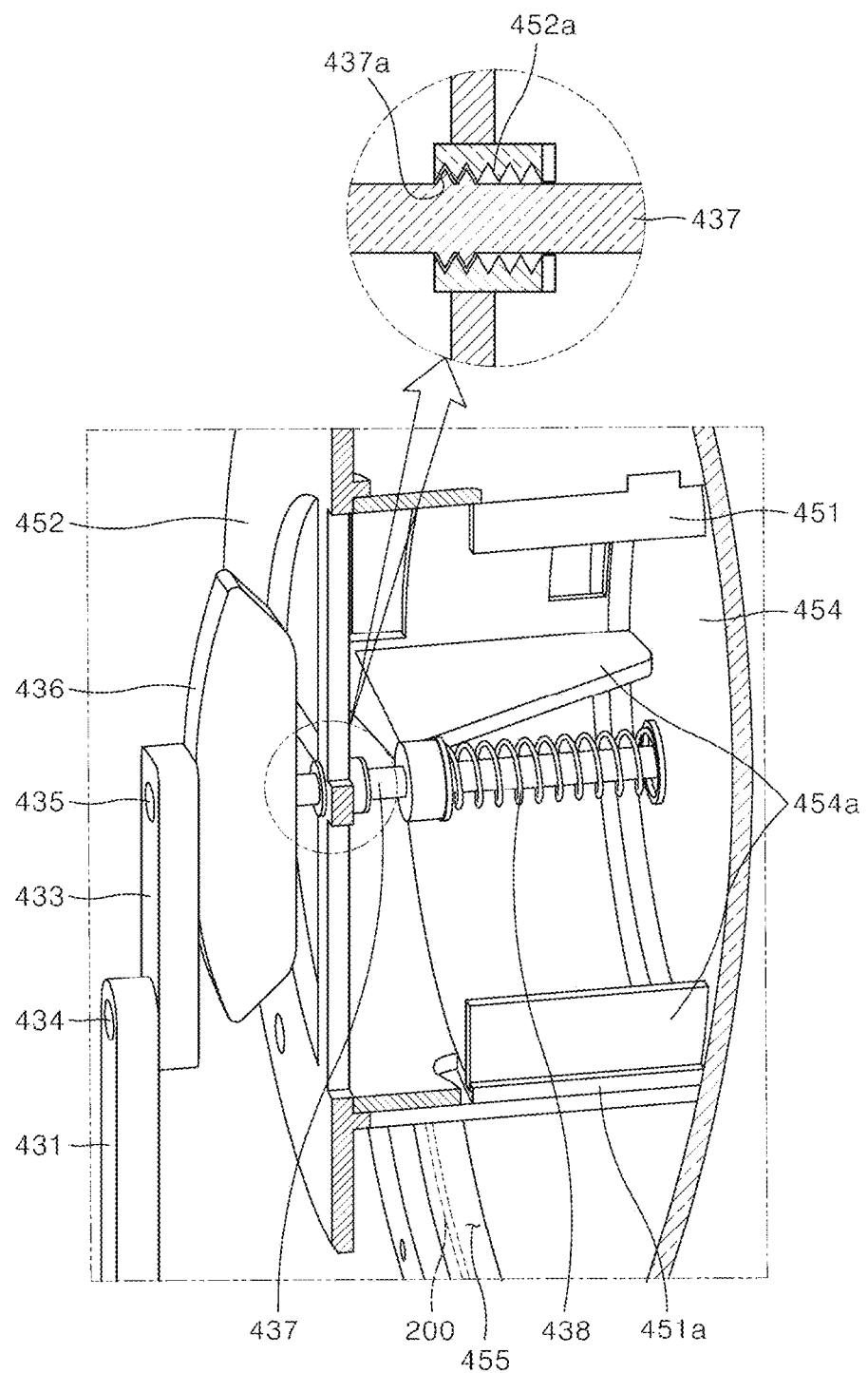
FIG. 8 is a cross-sectional view showing a ventilator of the automatic ventilation module of the power electronic device based on FIG. 3.
Figure 9:
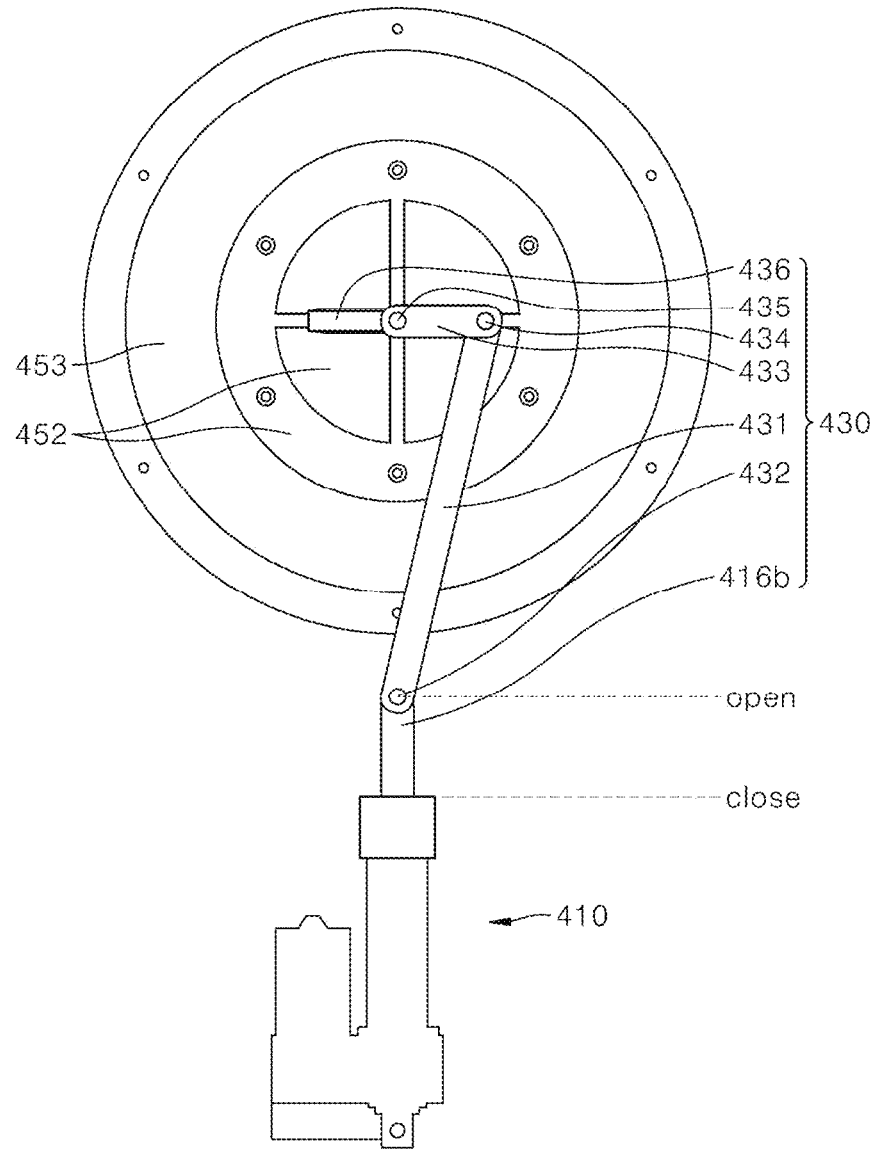
FIG. 9 is a rear view showing an open state of the ventilation hole of the automatic ventilation module of the power electronic device according to the present disclosure.
Figure 10:
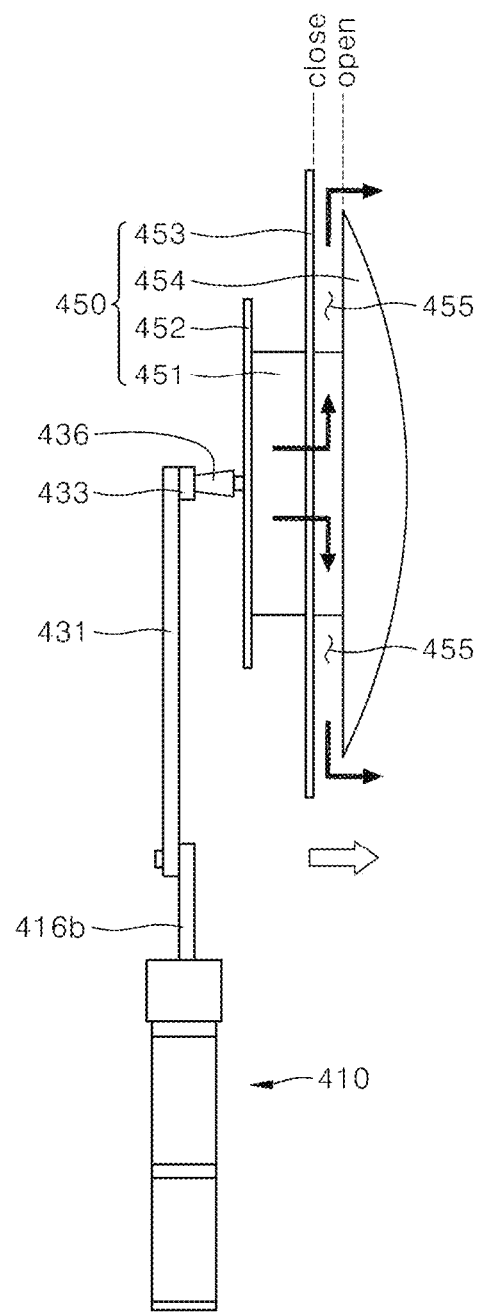
FIG. 10 is a side view showing the open state of the ventilation hole of the automatic ventilation module of the power electronic device according to the present disclosure.
Figure 11:
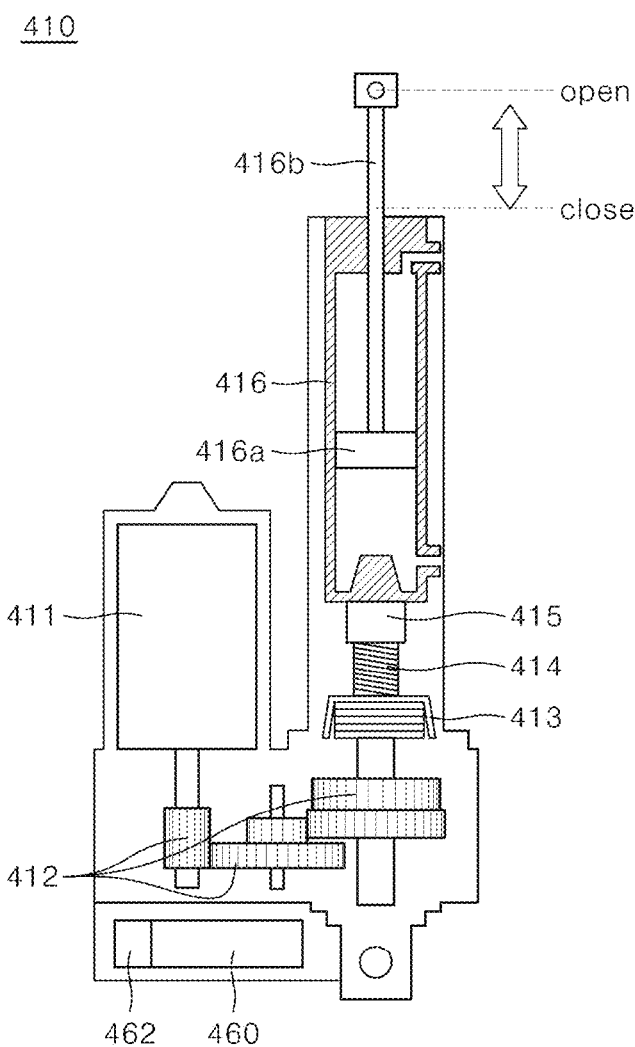
FIG. 11 is a cross-sectional view showing an operation state of the driver in the open state of the ventilation hole based on FIG. 5.

FIG. 3 is a perspective view showing a power electronic device having an automatic ventilation module according to an embodiment of the present disclosure. FIG. 4 is a schematic diagram showing an inside of the power electronic device having the automatic ventilation module based on FIG. 3. FIG. 5 is a rear view showing a closed state of a ventilation hole of the automatic ventilation module of the power electronic device according to the present disclosure. FIG. 6 is a side view showing the closed state of the ventilation hole of the automatic ventilation module of the power electronic device according to the present disclosure. FIG. 7 is a cross-sectional view showing an operation state of a driver in the closed state of the ventilation hole based on FIG. 5. FIG. 8 is a cross-sectional view showing a ventilator of the automatic ventilation module of the power electronic device based on FIG. 3. FIG. 9 is a rear view showing an open state of the ventilation hole of the automatic ventilation module of the power electronic device according to the present disclosure. FIG. 10 is a side view showing the open state of the ventilation hole of the automatic ventilation module of the power electronic device according to the present disclosure. FIG. 11 is a cross-sectional view showing an operation state of the driver in the open state of the ventilation hole based on FIG. 5.

As shown in FIG. 3 and FIG. 4, a power electronic device 100 according to an embodiment of the present disclosure has a casing 200 constituting an exterior appearance, a main part accommodated inside the casing 200, and a blow fan 300 and an automatic ventilation module 400 for heat-dissipation. The automatic ventilation module 400 may operate in conjunction with the blow fan 300. The power electronic device 100 may be, for example, an inverter. The main components accommodated inside the power electronic device 100 may include a main circuit 270 and an auxiliary circuit (not shown).

The upper casing 210 constitutes an upper portion of the casing 200, and the lower casing 230 constitutes a lower portion of the casing 200. When necessary, an auxiliary case 250 may be additionally disposed under the lower casing 230. These upper and lower casings are joined together to form the casing 200. A plurality of through-holes inlet 210a extend through one side of the upper casing 210. The automatic ventilation module 400 is installed on the other side of the upper casing 210 facing toward the inlets 210a.

The main circuit 270 may be disposed inside the upper casing 210 of the casing 200. The main circuit 270 may include a switching element that switches DC power to output high-frequency power, for example, a transistor, a thyristor, a power transistor, an IGBT (Insulated Gate Bipolar Transistor), and the like.

The auxiliary circuit may be an element that generates relatively little heat and is not affected by foreign substances, and may include a DCR (Differential Current Relay) or an EMC (Electromagnetic Compatibility) filter. Although not shown in the drawing, the auxiliary circuit may be installed inside the lower casing 230.

The blow fan 300 may be installed adjacent to the inlet 210a and may be installed adjacent to the main circuit 270 which generates a relatively larger heat amount than the auxiliary circuit does. The blow fan 300 blows air heated by the heat generated from the main circuit 270 toward the automatic ventilation module 400. The blow fan 300 may operate in conjunction with the automatic ventilation module 400. For example, the blow fan 300 may be controlled to operate when a ventilation hole 455 which will be described later is opened.

As shown in FIG. 5 to FIG. 11, the automatic ventilation module 400 may include a driver 410 for providing power, a connector 430 connected to the driver 410, a ventilator 450 receiving the power from the driver 410 by the connector 430 to open or close one side of the casing 200, and a controller 460 to control the driver 410.

The automatic ventilation module 400 may be controlled to open or close a portion of the casing 200 based on a temperature of a component that generates heat, such as the main circuit 270. Alternatively, the automatic ventilation module 400 may be controlled to open or close a portion of the casing 200 based on a temperature inside an entirety of the casing 200. Alternatively, the automatic ventilation module 400 may be controlled to open or close a portion of the casing 200 based on a user's manual control or a preset control sequence, an internal operation of the inverter, and the like.

As shown in FIG. 7 and FIG. 11, the driver 410 may include a motor 411 that generates the power, a power transmission that is connected to the motor 411 to change a power transmission direction, and a cylinder 416 that receives power and thus moves linearly. A piston 416a and a piston rod 416b are coupled to the cylinder 416.

The motor 411 receives external power and rotates in a forward or reverse direction to generate the power. The motor 411 is electrically connected to the controller 460 and rotates forwards or reversely based on control of the controller 460.

For example, when the motor 411 rotates forwards, the piston rod 416b may rise up and move to an open position. Conversely, when the motor 411 rotates in a reverse direction, the piston rod 416b is lowered and moves to a closed position.

The power transmission may include a gearbox 412 composed of a plurality of gears, a ball bearing 413 connected to the gearbox 412, a screw 414 connected to the ball bearing 413, a bushing 415, and the like. A rotational force of the motor 411 is transmitted to the piston 416a of the cylinder 416 via the power transmission to raise and lower the piston 416a. A structure shown in the drawings is only illustrated while taking an electric cylinder as a known scheme by way of example. However, the present disclosure is not limited to the drawings and the above description. The rotational force of the motor 411 may be transmitted to the piston 416a using a pulley structure with a belt, etc. Alternatively, other mechanisms capable of converting the rotational motion of the motor 411 into a linear motion may be applied.

The cylinder 416 may be embodied as an electric cylinder. The piston 416a is inserted therein. The piston rod 416b is connected to a top face of the piston 416a. The piston 416a receives the power from the motor 411 and thus is raised up or lowered down. Because the inverter is presented as an example of the power electronic device 100 in the present disclosure, a structure of the electric cylinder is presented as an example for utilization of an internal space. However, when the power electronic device 100 may secure a sufficient space therein, a hydraulic or pneumatic cylinder may be applied. One end of the piston rod 416b is exposed upwardly of the cylinder 416.

When the piston 416a is maximally raised within the cylinder 416, an upper end position of the piston rod 416b becomes an open position. When the piston rod 416b is maximally lowered, the upper end position of the piston rod 416b becomes a closed position. The connector 430 is connected to the piston rod 416b to transmit the power.

As shown in FIG. 5 and FIG. 6, FIG. 9 and FIG. 10, the connector 430 includes a first link 431 coupled to the piston rod 416b, a first hinge pin 432 pivotally coupled to the piston rod 416b and the first link 431, a second link 433 coupled to the first link 431, a second hinge pin 434 pivotally coupled to the first link 431 and the second link 433, a rotator 436, and a fastening bolt 435 coupling the rotator 436 and the second link 433 to each other in a pivotable manner. The fastening bolt 435 is coupled to a center of an outer face of the rotator 436, and a movable rod 437 is integrally formed with the rotator at a center of an inner face of the rotator. A spring 438 is inserted into an outer circumferential face of the movable rod 437.

The first link 431 has a straight bar shape with a predefined length. One end of the first link 431 is connected to an exposed end of the piston rod 416b and the opposite end thereof is connected to one end of the second link 433. Therefore, one end of the first link 431 acts as a lower end, and the opposite end of the first link 431 acts as an upper end. The first link 431 is pivotally coupled to the piston rod 416b via the first hinge pin 432. The first link 431 pushes up the second link 433 while being raised up or lowered down by the piston rod 416b.

In the closed position before the piston rod 416b is raised up, the first link 431 together with the piston rod 416b and the second link 433 are oriented in a line along a vertical direction.

A sum of lengths of the first link 431 and the second link 433 and a length of an exposed portion of the piston rod 416b in the closed position becomes a maximum displacement by which the first link 431, the second link 433, and the piston rod 416b may travel. This is because the piston rod 416b, the first link 431 and the second link 433 are connected to each other.

Therefore, when the first link 431 rises up from the closed position to the open position by the piston rod 416b, the first link 431 cannot rise up in a straight manner but pivots so that an upper end thereof has a larger pivoting angle than a lower end thereof.

The second link 433 has a straight bar shape having a length smaller than that of the first link 431. One end of the second link 433 is pivotally coupled to the first link 431 via the second hinge pin 432, and the opposite end thereof is fixed to a center of the rotator 436 via the fastening bolt 435. Therefore, the second link 433 has one end as a lower end and the opposite end as an upper end.

The second link 433 and the first link 431 are oriented in a line along the vertical direction in the closed position. The second link 433 pivots by the first link 431 so that a lower end thereof has a larger pivoting angle than that of an upper end thereof in the open position. Because the upper end of the second link 433 is fixed to the rotator 436, the rotator 436 rotates when the second link 433 pivots.

The rotator 436 is embodied as a plate-shaped rotator with a predefined size, and is oriented in a line with the second link 433 in the closed position. The upper end of the second link 433 is fixed to a center of the outer face of the rotator 436 via the fastening bolt 435. The rotator 436 rotates by 90 degrees from an initial position by the second link 433 in the open position. Although a case in which the rotator 436 rotates by 90 degrees in this embodiment has been described, a rotation angle of the rotator 436 may vary based on change in a design of a screw structure to be described later. That is, the rotation angle of the rotator 436 may vary as long as the rotation angle may allow the ventilation hole 455 which will be described later to be opened or closed.

The movable rod 437 coupled to a center of the inner face of the rotator 436 pushes a front plate 454 of the ventilator 450 according to the rotation of the rotator 436 (herein, the outer face of the rotator 436 means a face thereof coupled to the second link 433. The inner face of the rotator 436 means a face thereof which faces toward the ventilator 450 and which is not visible from a direction of FIG. 5 or FIG. 9).

One end of the movable rod 437 is integrally formed with the rotator 436, and the opposite end thereof is integrally formed with an inner face of the front plate 454. The movable rod 437 is elastically supported by a spring 438 coupled to an outer circumferential face thereof. When the movable rod 437 changes from the closed position to the open position, the movable road is rotated by the rotator 436 and presses the front plate 454 which will be described later toward an outside of the casing 200. At this time, the spring 438 is compressed by the rotational force of the rotator 436. The movable rod 437 pulls the front plate 454 toward the casing 200 while rotating when changing from the open position to the closed position. At this time, the front plate 454 may be easily returned to its original position by a restoring force of the spring 438.

In order that the movable rod 437 pushes and pulls the front plate 454 while the movable rod 437 rotates along with 90 degrees rotation of the rotator 436, the movable rod 437 rotates and is displaced in the moving direction of the front plate 454 at the same time. Therefore, the movable rod 437 is formed in a cylindrical shape and has a screw thread 437a on the outer circumferential face thereof. A screw groove 452a corresponding to the screw thread 437a is defined in a rear plate of the ventilator 450 as shown in FIG. 8.

As shown in FIG. 5, FIG. 6, and FIG. 8, the ventilator 450 includes a cylindrical body 451 passing through one side of the casing 200, a rear plate 452 constituting a rear face of the body 451, a middle plate 453 supporting the body 451 against the casing 200, and the front plate 454 moving in a horizontal direction relative to the middle plate 453. A hole that is defined between the middle plate 453 and the front plate 454 and is selectively opened is defined as a ventilation hole 455 (for convenience of description of a configuration of the ventilator, a plate face which is positioned inside the casing and is visible based on FIG. 5 is defined as a rear face, while a plate face which is positioned out of the casing is defined as a front face. Further, the horizontal direction means a direction perpendicular to a longitudinal direction of the first link, and becomes a moving direction of the front plate).

A circular hole corresponding to a shape of the body 451 may extend through one side of the casing 200. The cylindrical body 451 is inserted into the circular hole. The body 451 has an accommodating space defined therein, and both opposing ends thereof in the horizontal direction are opened. The rear plate 452 is coupled to a rear end of the two open ends, and the middle plate 453 is coupled or integrally formed with an outer circumferential face of the casing 200. The front plate 454 is exposed out of the casing 200.

A plurality of guide rails 451*a* protrude from an inner circumferential surface of the body 451 and extend in the horizontal direction. The guide rail 451*a* serves to guide the horizontal movement of the front plate 454. This will be described later.

The rear plate 452 is coupled to the rotator 436, and has a larger diameter than that of the body 451. The movable rod 437 pass through a center of the rear plate 452. As shown in FIG. 8, a center portion of the rear plate 452 has the screw groove 452*a* defined therein that is screw-coupled into the screw thread formed on the movable rod 437.

Further, a plurality of holes may be formed in a plate surface of the rear plate 452. Through these holes, the heated air inside the casing 200 may move into the body 451.

The middle plate 453 may be coupled to the outer circumferential face of the casing 200 or formed integrally with the outer circumferential face of the casing 200. The middle plate 453 supports the body 451 against the casing 200. The middle plate 453 having a larger diameter than that of the body 451 is disposed to stably support the body 451 in a state in which the body 451 is inserted into the circular hole formed in the casing 200. Although not shown in the drawing, the middle plate 453 is fixed to the casing 200 via bolting or the like to support the body 451.

Further, the middle plate 453 extends outwardly and radially from an outer end of the body 451 by a predetermined distance. This structure is intended to form a gap between the middle plate 453 and the front plate 454.

Accordingly, the heated air inside the casing 200 is discharged out of the casing 200 through the gap defined between the middle plate 453 and the front plate 454. Therefore, the middle plate 453 may be partially disposed outside the casing 200 so that the front plate 454 may closely contact the middle plate in the closed position.

However, without the middle plate 453, the front plate 454 is directly in close contact with or separated from the plate surface of the casing 200, so that the open end of the body 451 may be opened and closed.

The front plate 454 has a disk shape, and has a shape protruding convexly as the plate extends from an edge to a center thereof. A direction in which the plate surface of the front plate 454 protrudes is a direction toward an outer face of the casing 200.

The front plate 454 moves along the horizontal direction of the casing 200 by the movable rod 437 and opens and closes the ventilation hole 455. A plurality of front supporters 454*a* are disposed on an inner surface of the front plate facing toward the body 451 to prevent the front plate 454 from shaking or tilting when the front plate 454 is moving.

The front supporter 454*a* may extend along a longitudinal direction of the guide rail 451*a*, and may have a plate shape with a predefined size. The front supporter 454*a* moves horizontally along the guide rail 451*a* when the front plate 454 moves in the horizontal direction while the front supporter is inserted into the guide rail 451*a*. The front supporter 454*a* moves only as much as the front plate 454 moves, so that the front support is not completely separated from the guide rail when being inserted into the guide rail 451*a*. Therefore, the front plate 454 may move stably.

In the closed position, the front plate 454 is in close contact with the middle plate 453 to remove the ventilation hole 455. In the open position, the front plate 454 is spaced from the middle plate 453 to create the ventilation hole 455.

The ventilation hole 455 does not extend through one of the components of the ventilator 450, but is created or removed based on the opening and closing of the front plate 454. Both opposing ends of the body 451 in the horizontal direction are open and the hole pass through the rear plate 452, such that when the front plate 454 is spaced from the middle plate 453, an open space is created between the open end of the body 451 and the front plate 454. Because the heated air inside casing 200 is discharged through this open space, this space is defined as the ventilation hole 455.

The horizontal displacement of the front plate 454 corresponds to the vertical displacement of the piston rod 416*b*. These two displacements are not equal to each other. However, the ventilator 450 operates in conjunction with the driver 410 by the connector 430, the horizontal displacement of the front plate 454 may be increased or decreased based on the increase or decrease of the vertical displacement of the piston rod 416*b*. Therefore, adjusting the vertical displacement of the piston rod 416*b* may allow the horizontal displacement of the front plate 454 to be adjusted.

Further, an operation of the piston rod 416*b* and opening and closing of the ventilation hole 455 may be associated with each other in the opposite manner to the above mentioned manner. A force transmission direction, the displacement of the piston rod 416*b*, and the opening/closing displacement of the ventilation hole 455 may be adjusted depending on a configuration of the power transmission.

In one example, as shown in FIG. 7 and FIG. 11, the controller 460 may be disposed on one side of the driver 410, and may include a temperature sensor 462. Although not shown in the drawing, the controller 460 is electrically connected to the driver 410, the temperature sensor 462, and the blow fan 300 and controls or communicates with the driver 410, the temperature sensor 462, and the blow fan 300. The controller 460 may determine whether to execute the ventilation based on a temperature of the main circuit 270 based on a measured value of the temperature sensor 462. Further, the controller 460 may control whether the ventilation hole 455 is opened or closed and a degree of the opening, based on the measured value of the temperature sensor 462.

Although the temperature sensor 462 is shown adjacent to the controller 460 for convenience of illustration in FIG. 7 and FIG. 11, the temperature sensor 462 may be installed adjacent to the main circuit 270 for accurate temperature measurement thereof.

For example, when the measured value of the temperature sensor 462 is lower than a preset first threshold value, the controller 460 may operate only the blow fan 300 and maintain the ventilation hole 455 in a closed state. When the measured value of the temperature sensor 462 is between the preset first threshold value and a present second threshold value, the controller 460 may move the front plate 454 so that the ventilation hole 455 is created by a preset minimum spacing while operating the blow fan 300. When the measured value of the temperature sensor 462 exceeds the preset second threshold value, the controller 460 may move the front plate 454 to maximize the opening amount of the ventilation hole 455 while operating the blow fan 300.

In the above-described method, because optimal heat-dissipation and ventilation are automatically performed based on the temperature of the main circuit 270, the heat-dissipation efficiency of the main circuit 270 may be improved. Further, because the air inlet is formed at only a minimum amount, an effect of minimizing the inflow of foreign substances from the outside may be realized.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. A power electronic device comprising:
   a casing constituting an exterior appearance of the device; and
   an automatic ventilation module installed on one side of the casing for opening or closing a portion of the casing,
   wherein the automatic ventilation module includes:
      a driver installed on one side of an inner space of the casing for generating power;
      a connector for transmitting the power generated from the driver;
      a ventilator having a front plate to receive the power from the connector and to open or close a portion of the casing using the power;
      a controller configured to control the driver to adjust an opening or closing amount of the front plate, and
   wherein the ventilator further includes:
      a cylindrical body passing through one side plate face portion of the casing, wherein the body has two opposing open ends; and
      a rear plate coupled to a first one of the two open ends of the body, disposed in the inner space of the casing and having a hole in a plate face portion thereof.

2. The device of claim 1, wherein a displacement amount of the front plate is adjusted based on a displacement amount of the driver.

3. The device of claim 1, wherein the driver includes:
   a motor rotating in a forward or reverse direction;
   a power transmission for converting a rotational motion of the motor into a linear motion of the power transmission;
   a piston rod and a piston raised up or lowered down by a power output from the power transmission; and
   a cylinder accommodating therein the piston;
   wherein one end of the piston rod is exposed out of the cylinder.

4. The device of claim 3, wherein the connector includes:
   at least one link pivotally connected to the piston rod; and
   a rotator coupled to the at least one link and rotated by a predetermined angle by the at least one link.

5. The device of claim 4, wherein the connector further includes a movable rod having one end connected to one side of the rotator and an opposite end connected to the front plate, wherein the movable rod pushes or pulls the front plate based on a rotation direction of the rotator.

6. The device of claim 5, wherein the front plate opens or closes a second one of the two open ends of the body.

7. The device of claim 6, wherein the movable rod has a screw thread formed on an outer circumferential face thereof, and passes through the rear plate and is coupled to the front plate,
wherein the rear plate has a screw groove corresponding to the screw thread, wherein the groove is defined in a portion of the rear plate through which the movable rod passes.

8. The device of claim 6, wherein the connector includes:
   a first link having one end pivotally coupled to the piston rod and an opposite end that extends forward towards the rotator; and
   a second link having one end pivotally coupled to the first link and an opposite end fixed to the rotator.

9. The device of claim 8, wherein when the piston rod ascends, the first link ascends such that the second link rotates the rotator, and the movable rod to press the front plate in a direction away from the casing by the rotator.

10. The device of claim 1, wherein the automatic ventilation module further includes a temperature sensor installed in the inner space of the casing to measure a temperature of the inner space or a temperature of a component accommodated in the inner space and generating heat,
wherein the controller is configured adjust the opening or closing amount of the front plate, based on a measurement result of the temperature sensor, a preset control sequence, or a manual manipulation by a user.

11. The device of claim 10, wherein the device further comprises a blow fan installed adjacent to the component generating the heat, wherein an operation of the blow fan is controlled by the controller.

12. The device of claim 11, wherein the controller is configured:
   when a measured value of the temperature sensor is lower than a preset first threshold value, to activate the blow fan and not to move the front plate;
   when the measured value of the temperature sensor is between the preset first threshold value and a preset second threshold value, to activate the blow fan and to move the front plate so that the front plate and the casing are spaced from each other by a preset spacing; or
   when the measured value of the temperature sensor exceeds the preset second threshold value, to activate the blow fan and to move the front plate so that the front plate and the casing are spaced from each other by a preset maximum spacing larger than the preset spacing.

13. A power electronic device comprising:
   a casing having an upper casing and a lower casing coupled to a bottom of the upper casing; and
   an automatic ventilation module including:
      a driver installed on one side of an inner space of the upper casing to generate power;
      a connector for transmitting the power generated from the driver;
      a ventilator having a front plate for receiving the power from the connector to open or close a portion of the upper casing;
      a controller configured to control the driver to adjust an opening or closing amount of the front plate, and
   wherein the ventilator further includes:
      a cylindrical body passing through one side plate face portion of the casing, wherein the body has two opposing open ends; and
      a rear plate coupled to one of the two open ends of the body, disposed in the inner space of the casing and having a hole in a plate face portion thereof.

14. The device of claim 13, wherein the driver includes:
   a motor rotating in a forward or reverse direction;

a power transmission for converting a rotational motion of the motor into a linear motion of the power transmission;

a piston rod and a piston lowered or raised by a power output from the power transmission; and a cylinder accommodating therein the piston, wherein one end of the piston rod is exposed out of the cylinder.

15. The device of claim 14, wherein the connector includes:

a first link having one end pivotally coupled to the piston rod and an opposite end extends forward towards the rotator;

a second link having one end pivotally coupled to the first link and an opposite end fixed to the rotator;

the rotator coupled to the second link and rotating by a predetermined angle by the second link; and a movable rod having one end connected to one side of the rotator and an opposite end connected to the front plate, wherein the movable rod is configured to push or pull the front plate, based on a rotation direction of the rotator.

16. The device of claim 15, wherein the front plate opens or closes a second one of the two open ends of the body.

17. The device of claim 16, wherein the movable rod has a screw thread formed on an outer circumferential face thereof, and pass through the rear plate and is coupled to the front plate, wherein the rear plate has a screw groove corresponding to the screw thread, wherein the screw groove is defined in a portion of the rear plate through which the movable rod pass.

18. The device of claim 17, wherein when the piston rod ascends, the first link ascends such that the second link rotates the rotator, and the movable rod to press the front plate in a direction away from the casing by the rotator.

* * * * *